(12) United States Patent
Clevenger et al.

(10) Patent No.: US 6,661,097 B1
(45) Date of Patent: Dec. 9, 2003

(54) TI LINER FOR COPPER INTERCONNECT WITH LOW-K DIELECTRIC

(75) Inventors: Larry Clevenger, LaGrangeville, NY (US); Stanley J. Klepeis, Poughkeepsie, NY (US); Hsiao-Ling Lu, Hsin-Chu (TW); Jeffrey R. Marino, Fishkill, NY (US); Andrew Herbert Simon, Fishkill, NY (US); Yun-Yu Wang, Poughquag, NY (US); Kwong Hon Wong, Wappingers Falls, NY (US); Chih-Chao Yang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/287,155

(22) Filed: Nov. 1, 2002

(51) Int. Cl.[7] .......................... H01L 21/44; H01L 29/40
(52) U.S. Cl. ....................... 257/763; 438/687
(58) Field of Search ................... 438/687, 643, 438/644, 653, 654, 761; 257/762, 763, 765, 750

(56) References Cited

U.S. PATENT DOCUMENTS

| 5,098,860 A | 3/1992 | Chakravorty et al. |
|---|---|---|
| 5,930,669 A | 7/1999 | Uzoh |
| 6,022,800 A | 2/2000 | Ho et al. |

OTHER PUBLICATIONS

Kneer "Process for removing contaminant from a surface and composition useful therefor" May 22, 2003 (filed Jun. 29, 2001). US 2003/0096500 A1.*

* cited by examiner

Primary Examiner—Craig Thompson
(74) Attorney, Agent, or Firm—Eric W. Petraske

(57) ABSTRACT

In copper backend integrated circuit technology, advanced technology using low-k organic-based interlayer dielectrics have a problem of carbon contamination that dos not occur in circuits using oxide as dielectric. A composite liner layer for the copper lines uses Ti as the bottom layer, which has the property of gettering carbon and other contaminants. The known problem with Ti of reacting with copper to form a high resistivity compound is avoided by adding a layer of TiN, which isolates the Ti and the copper.

20 Claims, 1 Drawing Sheet

TI LINER FOR COPPER INTERCONNECT WITH LOW-K DIELECTRIC

TECHNICAL FIELD

The field of the invention is that of fabricating integrated circuits using copper interconnect and low-k dielectric for the back end, in particular circuits having Tungsten or other refractory metal contacts that are mechanically and electrically connected to copper lines.

BACKGROUND OF THE INVENTION

In the course of developing a process for replacing aluminum with copper in the back end of integrated circuits, workers in the field soon realized that it was necessary to line or enclose the copper to prevent it from diffusing or otherwise escaping and reacting with the dielectric and/or having contaminants react with it.

Various liners were tried out, and the strengths and weaknesses of different combinations became known. One such combination that has been generally satisfactory is TaN/Ta.

In the particular case of a low-k interlayer dielectric, however, the process of forming trenches and vias to hold copper interconnect in Damascene style geometries, causes carbon to be released (e.g. by sputtering) from the dielectric material and be deposited over exposed surfaces of the lower conductor. The carbon is a significant contributor to open circuits at the interface between two levels of interconnect, especially between a W contact and copper at the next level.

It has been found that Ti has the property of gettering carbon very efficiently, and also gettering oxygen and nitrogen. Unfortunately, as those skilled in the art are aware, Ti reacts with Cu to form a compound having a high resistance. Therefore, those skilled in the art do not consider Ti to be a suitable material to line Cu interconnect.

Additionally, as dimensions shrink, it becomes important that the liner be thin. If the liner is too thick, the Cu will be too narrow and have too high a resistance. Every additional layer in the liner decreases the amount of copper and therefore increases the resistance of the interconnect.

Thus, those skilled in the art have not been able to solve the problem of providing a liner for Cu interconnect embedded in a low-k dielectric. The solution used for oxide dielectric—Ta/TaN—is not suitable.

SUMMARY OF THE INVENTION

The invention relates to a liner for Cu interconnect making contact with a lower level refractory material embedded in low-k dielectric having carbon as a constituent.

A feature of the invention is the use of a Ti lower layer covered with a TiN upper layer.

Another feature of the invention is a triple layer of Ti/CVD-TiN/Ta.

DETAILED DESCRIPTION

Figure 1:
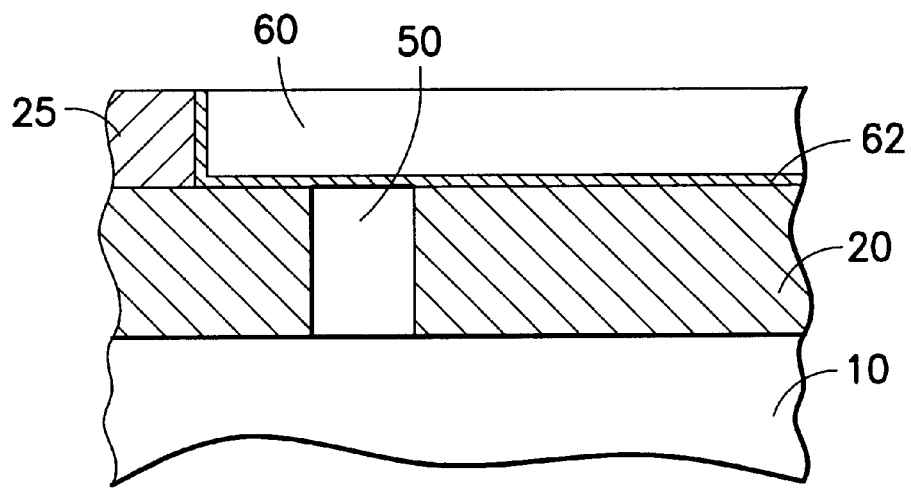
FIG. 1 illustrates in partially pictorial, partially schematic fashion, a cross section of a single damascene contact.

FIG. 1 shows a portion of a back end according to the invention, in which a W contact 50 has been formed in an aperture in dielectric 20, illustratively oxide, making contact with an electrode of a transistor or other device formed in substrate 10.

The problem addressed by the present invention is that of making contact between the top surface of contact 50 and the next level of interconnect, which is copper embedded in a low-k dielectric 25, such as SiLK(TM). Those skilled in the art are aware that this dielectric, as do many other low-k dielectrics, includes carbon. The carbon sputters or is otherwise released during the process of forming the aperture into which copper member 66 is deposited (including in that term, plated, sputtered, CVD, PVD, etc. ). In addition, oxygen and/or nitrogen may be on the surface, whether adhering or in the form of a compound. These two elements also degrade the quality of the electrical contact.

According to the invention, a first liner layer or film included within composite liner 62, denoting schematically one or more liners, is formed from Ti, deposited to a nominal depth sufficient to getter carbon, oxygen and nitrogen that have landed on the top surface of contact 50. The main mechanism of such contamination is sputtering from the dielectric, but other sources and mechanisms are possible. Illustratively, the thickness of the first layer is 2–5 nm and is deposited by PVD or CVD.

Next, a second liner layer of TiN is deposited, e.g. by CVD, also within composite liner 62. The function of this layer is to block the Ti and the Cu from coming in contact and reacting to form a high resistivity layer.

Since carbon can deposit on the entire bottom of the trench that holds the copper, the Ti should be deposited all along the bottom of the trench. The conductivity of the liner will only matter at the interface with contact 50, but the problem of carbon contamination is not confined to that area.

Optionally, a third liner layer of Ta could be deposited to a thickness of 10–20 nm. The Ta has the benefit of forming a good interface, i.e. epitaxial, with Cu, which has a good resistance to electromigration. In addition, the Ta layer is a blocking layer as well. Thus, the TiN, which presents a risk of corrosion, can be eliminated if the Ta layer is used as a combined blocking layer and interface improvement layer.

Those skilled in the art will be aware that other optional steps, such as sputter cleaning or other cleaning of the surface of contact 50 may be performed, if desired. Conventionally, a seed layer of copper is also put down on the final liner layer.

The two layers have a combined thickness of 8 nm, compared with a nominal thickness of member 60 of 175–190 nm in current technology. The liner thickness is a non-trivial portion of the total thickness of the copper interconnect and can have a noticeable effect on RC time constants and other circuit properties. Similarly, at the top surface of contact 50, the nominal diameter is 120 nm and the liner layers take up 16 nm of it. Adding a third layer of Ta (nominally 10–20 nm) only increases the thickness.

The minimum thickness of the first liner layer of Ti will be determined by the need to getter contaminants. The minimum thickness of the second liner layer of TiN will be determined by the need to block or isolate the Ti and the Cu. These liners also confine the copper, which is another constraint that may increase the thickness required beyond what is needed for gettering and for blocking the Ti. In each case, the designer will add a margin to allow for manufacturing fluctuations.

Experiments have shown that the yield of a W-Cu contact according to the invention is much better than the prior art of TaN/Ta. In one experiment, the yield of a test structure according to the invention was 100%, while the corresponding yield of the prior art combination was ~80%

Figure 2:
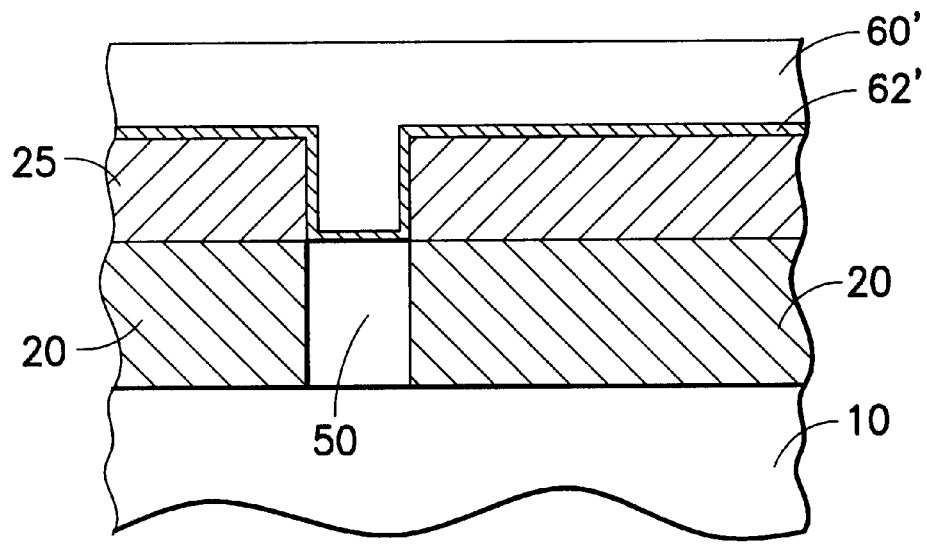
FIG. 2 illustrates in partially pictorial, partially schematic fashion, a cross section of a dual damascene contact.

FIG. 2 is similar to FIG. 1, showing a corresponding structure for a dual damascene aperture, in which copper interconnect 60' is placed above a conformal layer 62'. The processing is not significantly different, but the liner deposition is adjusted, as known to those skilled in the art, to improve the conformality of the liner layers.

Those skilled in the art will appreciate that materials other than Tungsten, e.g. the other refractory metals or polysilicon (referred to collectively as refractory materials), may be used for lower level connections such as M0, M1 or contact areas in the substrate. The structural components will be referred to as refractory metal contacts, since the portion of interest is the contact surface, regardless of the shape of the interconnect member that terminates in that surface. The type of structure is not confined to an integrated circuit and other structures fabricated with the same materials may make use of this invention, e.g. packaging structures or electro-mechanical systems. The material on which the structure is built is not confined to silicon and Si,Ge, GaAs or other materials may be used.

While the invention has been described in terms of a single preferred embodiment, those skilled in the art will recognize that the invention can be practiced in various versions within the spirit and scope of the following claims.

What is claimed is:

1. A method of forming an electrical interconnect structure comprising the steps of:
   providing a set of refractory material contacts embedded in a first interlevel dielectric;
   providing a second interlevel dielectric containing carbon disposed above said first interlevel dielectric;
   forming a set of openings in said second interlevel dielectric, at least some of which expose top surfaces of some of said contacts, whereby a contaminant from the group comprising carbon, oxygen and nitrogen deposits on said top surfaces;
   depositing a first liner layer of Ti in said set of openings, whereby said Ti getters said contaminant;
   depositing a second liner layer above said first liner layer; and depositing copper above said second liner layer in said openings to form a layer of interconnect.

2. A method according to claim 1, in which said electrical interconnect structure is a portion of an integrated circuit.

3. A method according to claim 1, in which at least some of said set of metal contacts are tungsten.

4. A method according to claim 2, in which at least some of said set of metal contacts are tungsten.

5. A method according to claim 1, in which said first liner layer has a thickness sufficient to getter said contaminants.

6. A method according to claim 2, in which said first liner layer has a thickness sufficient to getter said contaminants.

7. A method according to claim 4, in which said first liner layer has a thickness sufficient to getter said contaminants.

8. A method according to claim 2, in which said first liner layer has a thickness of greater than 2 nm.

9. A method according to claim 5, in which said first liner layer has a thickness of greater than 2 nm.

10. A method according to claim 7, in which said first liner layer has a thickness of greater than 2 nm.

11. A method according to claim 4, in which said second liner layer has a thickness sufficient to isolate said Ti and said copper.

12. A method according to claim 11, in which the material of said second liner layer is selected from the group comprising TiN and Ta.

13. A method according to claim 4, further comprising a step of depositing a third liner layer of Ta.

14. A method according to claim 4, in which said first liner layer is deposited by one of PVD and CVD.

15. A method according to claim 4, in which said second liner layer is deposited by CVD.

16. An interconnect structure comprising:
    a set of refractory material contacts embedded in a first interlevel dielectric;
    a second interlevel dielectric containing carbon;
    a first level of copper interconnect disposed in a set of openings in said second dielectric, at least some of which openings expose top surfaces of some of said refractory material contacts to said first level of copper interconnect,
    said copper interconnect comprising;
       a first liner layer of Ti in said set of openings;
       a second liner layer of TiN disposed above said first liner layer; and
       a copper interconnect member disposed above said second liner layer in said openings.

17. An interconnect structure according to claim 16, in which:
    said interconnect structure is contained within an integrated circuit.

18. An interconnect structure according to claim 17, in which:
    said refractory material is tungsten and said first liner layer includes carbon gettered from said top surfaces of some of said refractory material contacts.

19. An interconnect structure according to claim 18, further comprising:
    a third liner layer of Ta.

20. An interconnect structure according to claim 18, in which:
    said first liner layer has a thickness sufficient to getter carbon and said third liner layer has a thickness sufficient to isolate said Ti and said copper.

* * * * *